US006856569B2

(12) United States Patent
Nelson et al.

(10) Patent No.: US 6,856,569 B2
(45) Date of Patent: Feb. 15, 2005

(54) METHOD AND SYSTEM FOR MERGING MULTIPLE FUSE DECOMPRESSION SERIAL BITSTREAMS TO SUPPORT AUXILIARY FUSEBLOW CAPABILITY

(75) Inventors: Erik A. Nelson, Waterbury, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 10/248,337

(22) Filed: Jan. 10, 2003

(65) Prior Publication Data

US 2004/0136257 A1 Jul. 15, 2004

(51) Int. Cl.[7] .............................................. G11C 29/00
(52) U.S. Cl. ..................... 365/225.7; 364/200; 364/201
(58) Field of Search ............................. 365/225.7, 200, 365/201

(56) References Cited

U.S. PATENT DOCUMENTS

| | | | |
|---|---|---|---|
| 5,255,227 A | | 10/1993 | Haeffele |
| 5,687,114 A | * | 11/1997 | Khan ..................... 365/185.03 |
| 5,764,577 A | | 6/1998 | Johnston et al. |
| 5,801,999 A | | 9/1998 | Satou et al. |
| 5,841,709 A | | 11/1998 | McClure |
| 5,920,515 A | | 7/1999 | Shaik et al. |
| 5,946,257 A | * | 8/1999 | Keeth .......................... 365/226 |
| 5,961,653 A | | 10/1999 | Kalter et al. |
| 5,987,632 A | | 11/1999 | Irrinki et al. |
| 6,067,262 A | | 5/2000 | Irrinki et al. |
| 6,181,614 B1 | | 1/2001 | Aipperspach et al. |
| 6,233,184 B1 | | 5/2001 | Barth et al. |
| 6,505,324 B1 | * | 1/2003 | Cowan et al. .................. 716/4 |
| 6,538,929 B2 | * | 3/2003 | Hiraki et al. ........... 365/189.05 |
| 6,704,228 B2 | * | 3/2004 | Jang et al. ................... 365/200 |

FOREIGN PATENT DOCUMENTS

JP          02188836 A  *  7/1990  ........... G06F/11/22

* cited by examiner

*Primary Examiner*—Richard Elms
*Assistant Examiner*—J. H. Hur
(74) *Attorney, Agent, or Firm*—Scully, Scott, Murphy & Presser; Richard A. Henkler, Esq.

(57) ABSTRACT

Multiple fuse decompression serial bitstreams support an auxiliary fuseblow capability utilizing on-chip storage and providing a composite capability of embedded memory address/data failure information. A multiple repair capability has an improved compression algorithm to compress fuse data with system level soft-set redundancy, and lends itself to self-repair design, and to provide repairs for temperature sensitive fails. An instruction based tester interface in a fuse control provides shift loaded instructions in which the sequence of test and fuse repair operations is variable to provide flexibility in the manufacturing, test and repair operations.

26 Claims, 3 Drawing Sheets

METHOD AND SYSTEM FOR MERGING MULTIPLE FUSE DECOMPRESSION SERIAL BITSTREAMS TO SUPPORT AUXILIARY FUSEBLOW CAPABILITY

BACKGROUND OF INVENTION

1. Technical Field

The present invention relates generally to a method and system for merging multiple fuse decompression serial bitstreams to support an auxiliary fuseblow capability, and more particularly pertains to such a method and system which utilizes on-chip storage and provides a composite capability of embedded memory address/data failure information.

2. Related Art

No prior art is known which applies fusing techniques as a method for repairing an ASIC design. All prior art techniques are individual solutions that allow a separate repair to each embedded memory in the ASIC. In contrast thereto, the method of the present invention uses fuses to repair memories that need repair, and allows the fuses to be shared, in a sense, at the ASIC design level.

SUMMARY OF INVENTION

Accordingly, it is a primary object of the present invention to provide a method and system for merging multiple fuse decompression serial bitstreams to support an auxiliary fuseblow capability utilizing on-chip storage and providing a composite capability of embedded memory address/data failure information.

Advanced ASIC designs with large amounts of embedded memory require a very competitive approach for supporting redundancy techniques for yield improvement, both at an initial wafer final test and at a later module test. Sharing fuses across multiple memories in an ASIC design system is a very new development area. Fuses are needed to implement redundancy, especially as the art moves forward with the development of ASICs with more embedded DRAM. It is desirable to provide a means for sharing fuses, and for reducing the required number of fuses through fuse repair data compression, since the fuse counts for such circuits are expected to be astronomical. This technique may be employed to program a particular chip with the capability of generating a unique serial string at power-up, the value of which is different for each different die.

The present invention provides a multiple repair capability having an improved compression algorithm to compress fuse data, and also provides an additional capability for system level soft-set redundancy. The subject invention lends itself to self-repair design, and to provide repairs for temperature sensitive fails. An instruction based tester interface in the fuse control provides shift loaded instructions in which the sequence of the fuse repair data is variable to provide flexibility in test and fuse repair data flow.

BRIEF DESCRIPTION OF DRAWINGS

The foregoing objects and advantages of the present invention for a method and system for merging multiple fuse decompression serial bitstreams to support an auxiliary fuseblow capability may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION

As a background concerning redundancy and typical fuse repair data, some die which include embedded DRAM are perfect products, in which case the fuse repair data in a fuse repair register are all 0s, other repairable die fail at relatively few random DRAM memory locations, with the few fail locations resulting in unused redundancy and long strings of 0s in the fuse repair data. Row redundancy results in a few 0s and 1s, and column redundancy results in long strings of 1 s in the fuse repair data.

Figure 1:
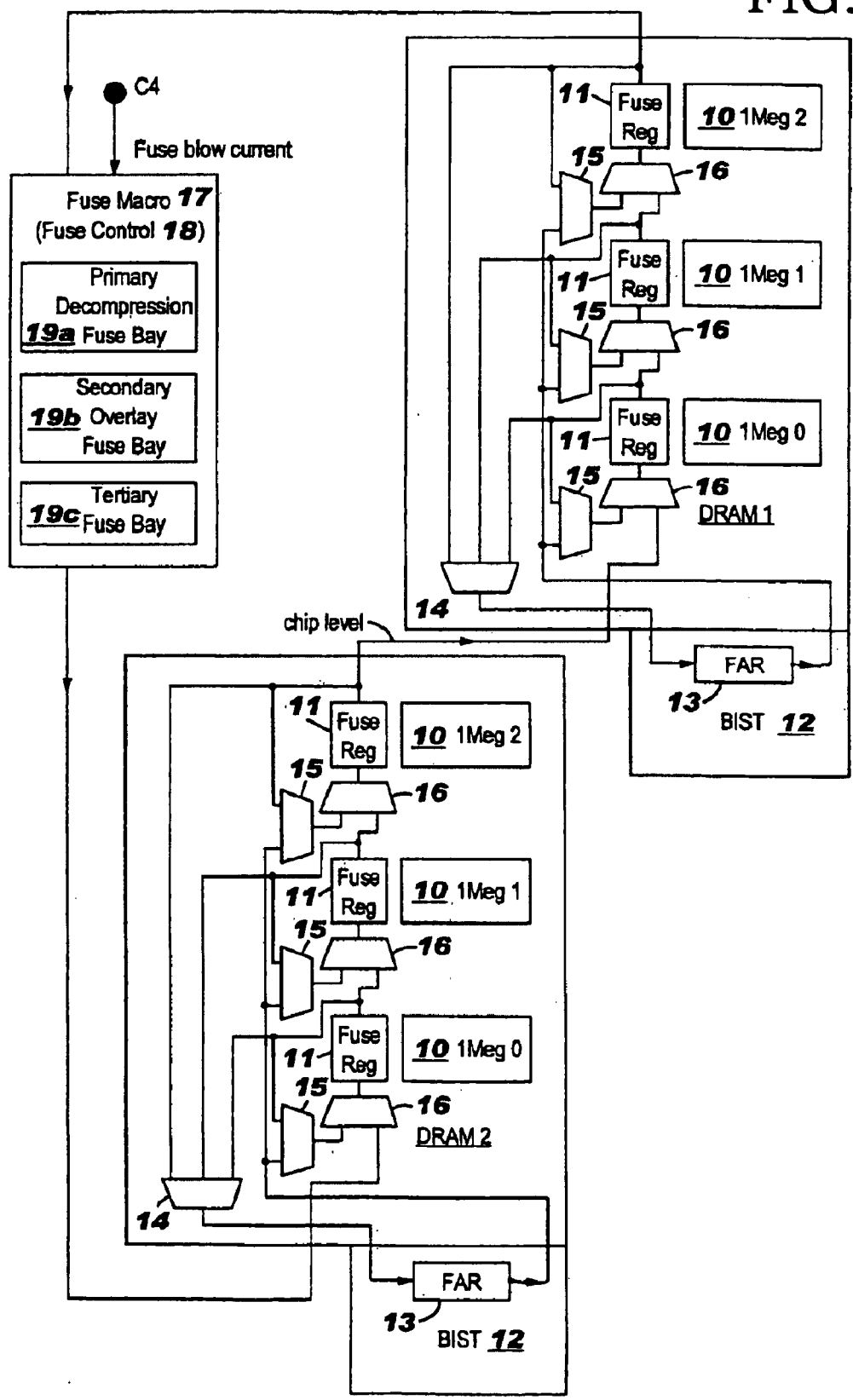
FIG. 1 illustrate major components of a chip repair e-fuse system for a chip with multiple embedded DRAM memories, each having similar 1 megabit sections of memory wherein each 1 megabit section is provided with its own fuse repair shift register.

FIG. 1 illustrate major components of a chip repair e-fuse system for a chip with multiple embedded DRAM memories, a first memory shown as DRAM 1 having multiple 1 megabit sections 10 of memory designated 1 Meg 0, 1 Meg 1, 1 Meg 2, and a second memory shown as DRAM 2 having similar 1 megabit sections of memory. Each 1 megabit section 10 is provided with its own fuse repair shift register 11.

Each DRAM memory is also provided with its own Built-In Self Test (BIST) 12 which has an associated Failing Address shift Register (FAR) 13. Each fuse repair register 11 sends serial fuse repair data at its output to the FAR register 13 through a 3:1 MUX 14 such that only one fuse repair register at a time sends fuse repair data to the FAR register 13. The fuse repair data output of the FAR register is directed to a series of a first 2:1 MUXs 15, and second 2:1 MUXs 16, one for each fuse register 11, to each fuse repair register 11, such that each fuse repair register 11 can be serially loaded with fuse repair data from the FAR register 13, one register at a time. The FAR register 13 is parallel loaded during BIST and is serially loaded during fuse repair data decompression.

Figure 2:
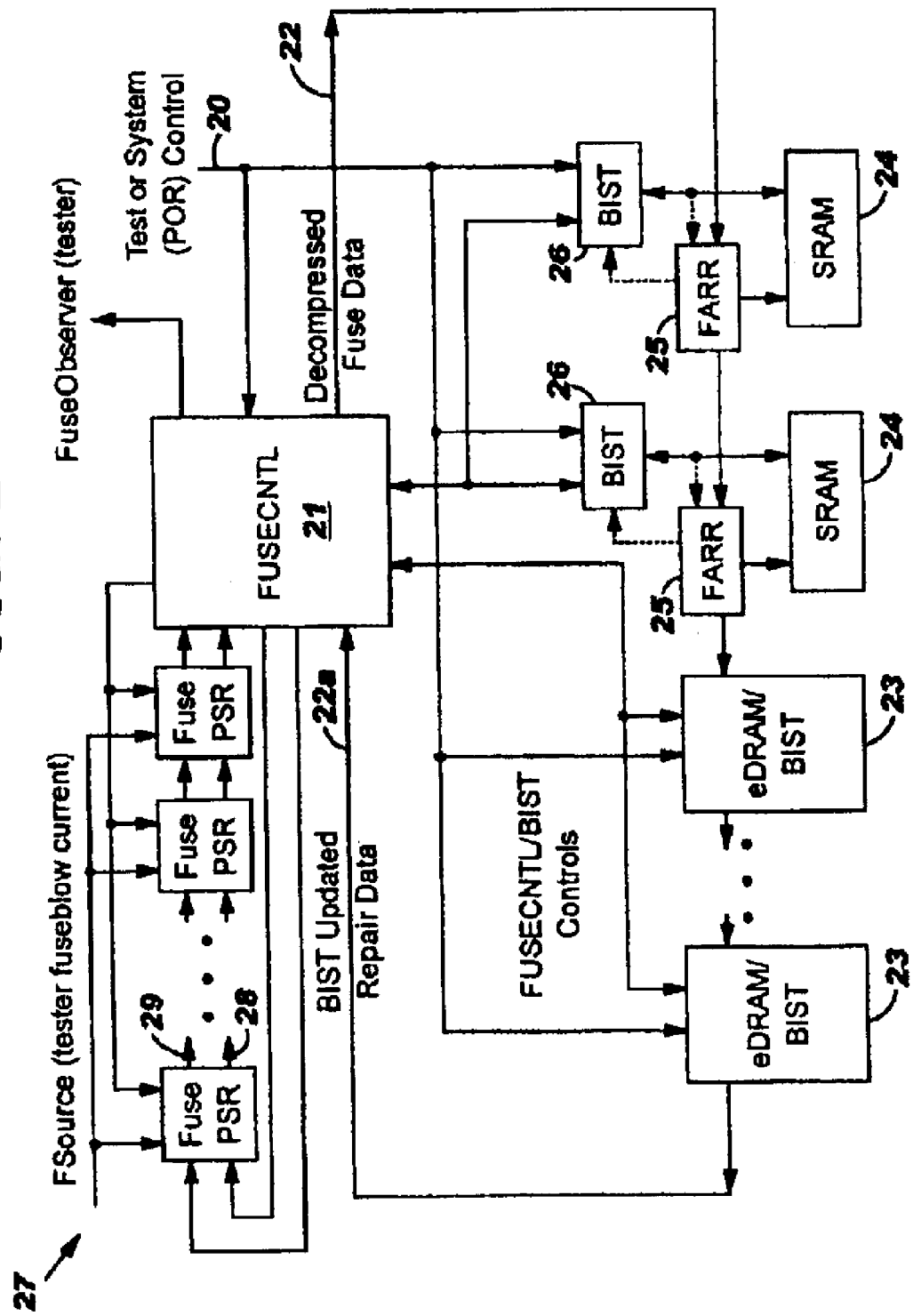
FIG. 2 illustrates the major functions and controls of the fuse control, and shows the flow of fuse repair data on programming of the fuses.

In the present invention a Failing Address Register (FAR) 13 for a DRAM or a Failing Address and Repair Register (FARR) 25, FIG. 2, for a SRAM is employed as a shift register during compression and decompression of fuse repair data. These registers are used as parallel loaded registers during Built-In Self Test (BIST), and provide a serial fuse repair data stream to a DRAM or SRAM. The FAR register 13 receives fuse repair data for one mega bit section 10 of memory from its associated fuse repair register 11, changes and updates the fuse repair data, and then loads the changed fuse repair data back into the associated fuse repair register 11

A fuse macro 17, which includes a system fuse control 18, is shared between all of the DRAM memories 1, 2 . . . n on the chip, and includes a primary decompression fuse bay 19a, a secondary overlay fuse bay 19b, and may even include further tertiary fuse bays 19c. The system fuse repair control 18 controls the processing of fuse repair data in the fuse macro 17.

Each fuse register 11 can be used during BIST as a temporary storage location for redundancy allocation logic (RAL) data (the BIST FAR register is shared between all 1 megabit sections 10). This may get somewhat more complicated, depending on the correspondence between failing BIST latches (especially for column redundancy) and fuse register latches. Once BIST is complete, all fuse repair registers' values can be shifted to the fuse macro 17 for compression and fuse blow using the primary fuse bay 19.

At a subsequent module test, the fuse macro 17 decompression is implemented prior to running BIST, and prior to testing a 1 meg section 10, the fuse repair data in the 1 meg's corresponding fuse register 11 can be shifted into the BIST FAR register 13, so that previously utilized redundant elements are not used again. The FAR register would then be set up to collect any additional fails that might occur at the module test, and the remaining available redundancy elements can be used to implement the additional fuse repair data solution, for example, a new fail that wasn't found at wafer test but is now found at the subsequent module test because the temperature is now different.

In summary, after each DRAM memory is tested, the fuse fail data stream is used to blow the primary decompression fuse bay 19a, after which each DRAM memory is retested, and the fuse fail data from the retest is used to blow the secondary overlay fuse bay 19b, and following a further retest to blow a tertiary overlay fuse bay 19c. The primary decompression fuse bay preferably uses compression of fuse repair data, while the secondary (and possibly tertiary) overlay fuse bay can store string count pointers and associated masking bits.

FIG. 2 illustrates the major functions and controls of the fuse control, and shows the flow of fuse repair data on programming of the fuses. A test or system (POR) control input at 20 controls the fuse control 21, which receives an input at 22a of the BIST updated fuse repair data and produces an output at 22 of decompressed fuse data.

FIG. 2 shows an exemplary chip having a plurality of embedded DRAM memories 23, each provided with BIST and labeled eDRAM/BIST (which can have the circuits of FIG. 1) and a plurality of embedded SRAM memories labeled SRAM 24, each of which is provided with a separate Failing Address and Repair Register (FARR) register 25, which functions as a FAR register (as shown in FIG. 1) with the added capability of providing repair, and a separate BIST 26 capability, and all of the eDRAM/BIST memories 23 and SRAM memories 24 are served by the fuse control 21. Each of the primary decompression fuse bay 19a, secondary overlay fuse bay 19b and tertiary fuse bay 19c is shown in a similar manner at 27 in FIG. 2, and are shown separately in more detail in FIGS. 3 and 4. Each fuse bay includes a plurality of serially connected Fuse Programmable Shift Registers labeled Fuse PSR, each of which includes an upper shift register producing an output at 29 and a lower shift register producing an output at 28, as shown in FIG. 2, each of which is connected to Fsource to provide a tester fuse-blow current, controlled by the fuse control 21. The corresponding individual bits of each upper and lower shift register can be ANDed, with a coincidence of 1 s causing a fuse blow, wherein when a first bit 1 of the upper shift register coincides with a first bit 1 of the lower shift register, the coincidence of 1s is ANDed to blow a first fuse, and etc. for the second . . . n bits and fuses.

Figure 3:
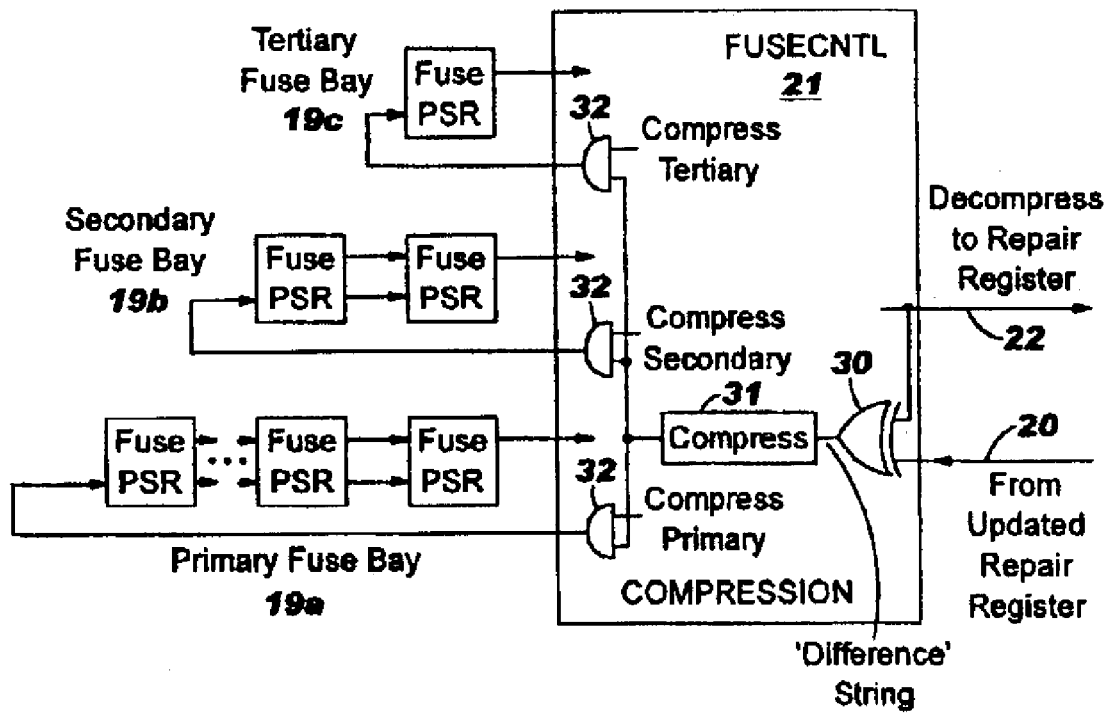
FIG. 3 illustrates the functions of the fuse control during the compression of fuse repair data.

FIG. 3 illustrates the functions of the fuse control 21 during the compression of fuse repair data. The fuse control 21 receives an input 20 of fuse repair data from an updated fuse repair register 11, and produces an output 22 of decompressed fuse repair data which it sends to a fuse repair register 11. An exclusive OR gate 30 compares the input at 20 with the output at 22, and produces a 0 output when its inputs are the same and produces a 1 output when its inputs are different.

The fuse repair data output of the exclusive OR gate 30 is a difference string of 1s and 0s which is compressed at 31, and sent to three AND gate 32, with the lower AND gate 32 being selectively enabled by a second control input to direct the fuse repair data stream to the primary fuse bay 19a, and the middle AND gate 32 being selectively enabled by a second control input to direct the fuse repair data stream to the secondary fuse bay 19b, and the upper AND gate 32 being selectively enabled by a second control input to direct the fuse repair data stream to the tertiary fuse bay 19c.

Figure 4:
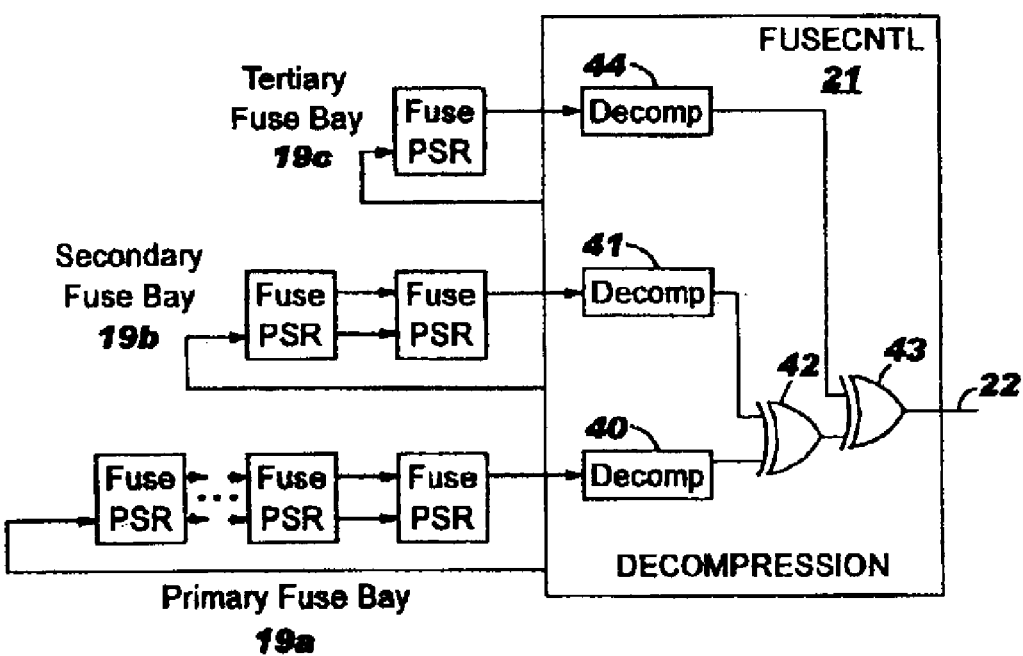
FIG. 4 illustrates the functions of the fuse control during the decompression of fuse repair data to form a serial fuse repair data stream at its output.

FIG. 4 illustrates the functions of the fuse control 21 during the decompression of fuse repair data to form the serial fuse repair data stream on output 22, which also forms an input to the exclusive OR gate 30 of FIG. 3. The serial fuse repair data output of the upper PSR registers of the primary fuse bay 19a is decompressed at 40, and the serial fuse repair data output of the secondary fuse bay 19b is decompressed at 41 is exclusively ORed at 42, the output of which is exclusively ORed at 43 with the decompressed output (from 44) of the serial fuse repair data of the tertiary fuse bay 19c.

The present invention utilizes the FAR register 13 within each embedded DRAM as a storage location for the RAL (Redundancy Allocation Logic) repair data. The present invention also provides for the serial transfer of fuse repair data from the FAR register to the fuse repair registers 11 and provides for the serial transfer of fuse repair data to the FAR register. There is only one FAR register 13 in each embedded DRAM macro, and it is serially shared between the multiple 1 megabit sections 10 of that DRAM memory that are being serially tested. By storing the RAL register fuse repair data of megabit section 10 in megabit section 0's fuse shift register 11, the FAR register 13 can then be used to test and generate the repair solution for megabit section 1, and etc. for successive megabit sections.

These capabilities provide several benefits.

The RAL repair solution for the whole memory can be recorded and acted upon at once. This simplification to the chip repair process has short and long term benefits. In the short term, the process of unloading repair data from the chip for off-line processing is streamlined. For the long term, hurdles to building a chip that fixes itself are being eliminated.

Cumulative repair solutions can be calculated by the FAR register for the RAL repair data once the ability to reload an initial solution is provided. Several test flow enhancements can be realized through applications of this compositing capability. Examples of test flow enhancements include test time reductions realized by supplementing initial repair solutions with additional repair actions for retention fails and improved yield recoveries realized by supplementing an initial wafer repair solution with additional repair actions for subsequent module fails.

In some cases of repair solution compositing, such as testing at two temperatures, it may be preferable to use a non-volatile storage media for the initial fuse data result. The primary fuse decompression bay 19a provides such a media. The purpose of the primary fuse decompression bay 19a is to permanently store a repair solution and transfer it to the FAR shift registers 13 when power is applied to the chip. This enables a wider application of the subject invention by broadening the type of initial repair solution that can be transferred to each FAR register 13 to include repair solutions that were generated during subsequent separate test passes, and stored the secondary overlay fuse bay 19b and tertiary fuse bay 19c.

The ability to create a composite repair solution from separate test passes enables the recovery of chips that fail during events that occur after the primary repair solution is stored in the primary fuse bay 19a, such as burn-in and/or low temperature testing. To realize this type of recovery, it is necessary to design the fuse macro 17 in such a way that the supplemental repairs can be added to the initial solution. There are several ways in which this can be accomplished depending on:

a) whether the primary fuse repair data solution is compressed or not.
 b) what type of encoding the redundancy scheme uses.
 c) whether or not the primary fuse bay 19a uses laser or efuses.

For chips where the primary repair solution is not compressed and the redundancy decode scheme is enabled binary addresses, a secondary fuse bay 19b is not needed. One could simply repeat the repair process, blowing fuses corresponding to the supplemental solution and re-blowing fuses for the primary solution, however there are more complex situations that could be well served by a secondary fuse bay 19b. Two examples that are well served by a secondary fuse array are, 1. when the primary fuse repair data solution is compressed, or
 2. if a large number of lasers fuses is used for the primary repair solution and a small number of e-fuses is desired for the supplementary repair.

For situations where a secondary fuse bay 19b, and even a tertiary fuse bay 19c, is desired, the present invention provides several techniques for identifying and storing supplemental solutions and then combining the stored supplemental solutions with the primary solutions.

The following techniques are intended to minimize the number of fuses needed in the secondary and tertiary fuse bays 19b, 19c.

1.) It is beneficial to identify those elements of the composite solution that are not present in the primary solution. This can be done by comparing the bit stream shifted out of the fuse shift registers 11 to the bit stream shifting out of the fuse macro 17. This separates the supplemental solution from the composite solution and eliminates the need to store the primary solution in the secondary bay.

2.) The supplemental repair solution can be stored in the secondary and tertiary fuse bays as a set of positions in the fuse shift string, and then setting those bits as they are shifted out of the fuse macro.

3.) The supplemental repair solution can be stored in the secondary and tertiary fuse bays using run length compression, as illustrated in FIG. 3, and then XORing the decompressed values with those from the primary fuse array as they are shifted out of the fuse macro, as shown in FIG. 4. This option is attractive because of it's ability to properly handle thermometric decoding, which is used for column redundancy. Thermometric decoding is decoding wherein a plurality of multiplexers is used to select a reduced number of bits from a greater number of bits. For instance, assume that 8 bits are being selected from a greater number of 9 bits, that a first multiplexer selects between the 0 and 1 bits, a second multiplexer selects between the 1 and 2 bits, a third multiplexer selects between the 2 and 3 bits, and etc. Assume further that the first multiplexer selects the lower 0 bit input, the second multiplexer selects the lower 1 bit input, the third multiplexer selects the higher 3 bit input (the 2 bit input is deselected). In a thermometric decoder, after the transition at the third multiplexer, the remaining multiplexers select the higher bit input.

Multiple options for implementing a change to the primary fuse bay's decompression bitstream may exist, as described above. A somewhat more elaborate scheme would allow programmability for selecting one of these various options for each modification that is specified in the secondary and tertiary fuse bays. For example, the secondary and tertiary fuse bays may be organized as multiple 28-bit words. The first bit in the word would be used to specify which modification operation needs to be done. The next 16 bits would define the decompression cycle # in which the modification operation would begin. The next 11 bits would be used to store either of two pieces of information a) the next 11 bits to be shifted out in lieu of or as a replacement to the next 11 bits of the primary data stream, or b) the 11 bits would be used to indicate how many cycles the primary data stream is to be inverted. This allows for the inversion of up to 2048 bits of the primary data stream. This word definition for the secondary array would then allow for two modification options, an 11-bit replacement modification, or an up to 2048 bit inversion modification.

The present invention uses a primary fuse bay to blow fuses and implement fixes at a first pass wafer test, and a secondary and possibly tertiary fuse bays to augment or overlay additional fixes uncovered at a subsequent module test. The primary solution can use fuse compression, and the secondary and tertiary solutions can store string count pointers and associated masking bits into the secondary and tertiary fuse bays. A rather intricate switching fabric using 2:1 multiplexers 15, 16 and n:1 (for n megabit sections) multiplexers 14 allows fuse repair data to be moved around from the fuse register 11 storage locations into the FAR register 13 and also provides a path to transfer the fuse repair data to the fuse macro 17 for compression and fuse-blow. A separate macro could be used to control all of the BIST engines and operate the auxiliary e-fuse compression.

The blending of redundancy solutions from a primary and secondary (and possibly tertiary) fuse compression macro can be realized in several different ways. The context of the discussion is one where a primary fuse compression macro 19a contains fuse repair data describing a complete set of redundancy actions, and a secondary macro 19b is provided to enable module level repair. For the purpose of this discussion it is assumed that the redundancy solution to be stored in the secondary macro is guaranteed to be independent of the solution in the first primary macro. Cases where this independence cannot be guaranteed have to be reviewed as special cases and treated accordingly.

The subject invention addresses the storage of fuse repair data in the secondary. (and possibly tertiary) macro separately from the subject of blending bit streams. Assuming that the contents of the secondary macro can be interrogated to provide the same type of information as the primary decompression macro, specifically a bit stream who's length is equal to the total number of fuse programmable latches on the chip, one can look at some logical combinations of primary and secondary data. Primary OR secondary works well for some redundancy schemes where insertion of secondary 1s into positions previously held by primary 0s provides the appropriate redundancy latch data. The existing column redundancy scheme for CU-11 DRAM uses thermometric decoding and would not be well served by an OR function because in cases where both primary and secondary macros contain repair actions for the same column redundancy domain, then primary 1s need to be changed to 0s. Primary XOR secondary, as shown in FIG. 4, works well for both the insertion of 1s into positions previously held by primary 0s and for overlaying thermometrically decoded solutions.

Storage of fuse repair data in the secondary macro 20 needs to provide the same type of information as the primary macro 19, specifically a bit stream who's length is equal to the total number of fuse programmable latches on the chip. There is a significant difference between primary and secondary macro requirements in that while the primary macro needs to contain a complete redundancy solution, the purpose of the secondary macro is to provide a backup repair opportunity, and as such, the amount of repair data that needs to be stored in the secondary macro is much smaller.

Design optimization may result in different compression formats being used for the two macros, driven by the difference in data volumes. Possibilities that should be included in the evaluation for an optimum compression format for the secondary fuse macro include the various types of run length compressions and also the possibility of simply storing the locations of all of the 1s. To cover the case where a DRAM column repair is required, one would need the capability to locate a string of up to 64 1s. The nature of the thermometric decoding used in the DRAM column redundancy may sway the compression format preference to run_length_0s_and_1s.

One embodiment of an ASIC product can use the CMOS9SF technology, and can use electrically blown fuses for the secondary and tertiary fuse bays and laser or electrically blown fuses for the primary fuse bay.

While several embodiments and variations of the present invention for a method and system for merging multiple fuse decompression serial bitstreams to support auxiliary fuse-blow capability are described in detail herein, it should be apparent that the disclosure and teachings of the present invention will suggest many alternative designs to those skilled in the art.

What is claimed is:

1. In an integrated circuit having a memory, a system for repairing defects in the memory comprising:
   a set of primary fuses for correcting defects discovered in the memory during a first test;
   a set of secondary fuses for correcting defects discovered in the memory during a second test;
   circuitry for blowing the primary and secondary fuses in correspondence with discovered defects; and
   wherein a failing address register (FAR) in the memory is used as a shift register during compression and decompression of fuse repair data, and is used as a parallel loaded register during Built-In Self Test (BIST), and provides a serial fuse repair data stream to the memory.

2. The system of claim 1, further including:
   a set of tertiary fuses for correcting defects discovered in the memory during a further test; and
   the circuitry blows the primary, secondary and tertiary fuses in correspondence with discovered defects.

3. The system of claim 1, wherein a fuse control provides shift register loaded instructions in which the sequence of test and fuse repair operations is variable to provide flexibility in manufacturing, test and repair.

4. The system of claim 1, wherein the FAR register receives fuse repair data for one section of memory at a time from a fuse repair register associated with that one section, changes and updates the fuse repair data, and then loads the changed fuse repair data back into the associated fuse repair register.

5. The system of claim 1, wherein the memory comprises a chip with multiple embedded DRAM memories.

6. The system of claim 5, wherein each DRAM memory is provided with its own Built-In Self Test (BIST) which has an associated FAR register, each fuse repair register sends serial fuse repair data at its output to the FAR register through a first set of multiplexers, such that only one fuse repair register at a time sends fuse repair data to the FAR register, the fuse repair data output of the FAR register is directed through a second set of multiplexers to each fuse repair register, such that each fuse repair register is serially loaded with fuse repair data from the FAR register, one register at a time.

7. The system of claim 5, including a fuse macro, which includes a fuse control for controlling the processing of fuse repair data in the fuse macro, which is shared between all of the DRAM memories on the chip, and includes a primary decompression fuse bay for the set of primary fuses and a secondary overlay fuse bay for the set of secondary fuses.

8. The system of claim 7, wherein the primary decompression fuse bay uses compression of fuse repair data, and the secondary overlay fuse bay stores string count pointers and associated masking bits.

9. The system of claim 8, wherein the fuse control receives an input of fuse repair data from an updated fuse repair register, and produces an output of decompressed fuse repair data which it sends to a fuse repair register, and an exclusive OR gate compares the input with the output.

10. In an integrated circuit having a memory, a method for repairing defects in the memory comprising:
    providing a set of primary fuses for correcting defects discovered in the memory during a first test;
    providing a set of secondary fuses for correcting defects discovered in the memory during a second test;
    blowing the primary and secondary fuses in correspondence with discovered defects; and
    using a failing address register (FAR) as a shift register in the memory during compression and decompression of fuse repair data, and using the FAR shift register as a parallel loaded register during Built-In Self Test (BIST), and to provide a serial fuse repair data stream to the memory.

11. The method of claim 10, further including:
    providing a set of tertiary fuses for correcting defects discovered in the memory during a further test; and
    blowing the primary, secondary and tertiary fuses in correspondence with discovered defects.

12. The method of claim 10, including providing shift register loaded instructions in which the sequence of test and fuse repair operations is variable to provide flexibility in manufacturing, test and repair.

13. The method of claim 11, including loading fuse repair data into the FAR register for one section of memory at a time from a fuse repair register associated with that one section, changing and updating the fuse repair data, and then loading the changed fuse repair data back into the associated fuse repair register.

14. The method of claim 10, including providing the memory in a chip with multiple embedded DRAM memories.

15. The method of claim 14, including providing each DRAM memory with its own Built-In Self Test (BIST) which has an associated FAR register, each fuse repair register sends serial fuse repair data at its output to the FAR register through a first set of multiplexers, such that only one fuse repair register at a time sends fuse repair data to the FAR register, the fuse repair data output of the FAR register is directed through a second set of multiplexers to each fuse repair register, such that each fuse repair register is serially loaded with fuse repair data from the FAR register, one at a time.

16. The method of claim 14, including providing a fuse macro, which includes a fuse control for controlling the processing of fuse repair data in the fuse macro, which is shared between all of the DRAM memories on the chip, and includes a primary decompression fuse bay for the set of primary fuses and secondary overlay fuse bay for the set of secondary fuses.

17. The method of claim 16, wherein the primary decompression fuse bay uses compression of fuse repair data, and the secondary overlay fuse bay stores string count pointers and associated masking bits.

18. The method of claim 17, including providing an input of fuse repair data to the fuse control from an updated fuse repair register, and producing an output of decompressed fuse repair data which it sends to a fuse repair register, and compares the input with the output with an exclusive OR function.

19. In an integrated circuit having a plurality of separate RAM memories, a system for repairing defects in the plurality of separate RAM memories comprising:
- a fuse macro that is shared between the plurality of separate RAM memories, and comprising a set of primary fuses for correcting defects discovered during a first test performed on the plurality of separate RAM memories, resulting in first fuse repair data that is compressed and stored as compressed fuse repair data in the set of primary fuses, and a set of secondary fuses for correcting defects discovered during a second subsequent test performed on the plurality of separate RAM memories, resulting in second fuse repair data that is stored in the set of secondary fuses;
- circuitry for blowing the primary and secondary fuses in correspondence with discovered defects.

20. The system of claim 19, wherein a failing address register (FAR) in the memory is used as a shift register during compression and decompression of fuse repair data, and is used as a parallel loaded register during Built-In Self Test (BIST), and provides a serial fuse repair data stream to the memory.

21. The system of claim 19, wherein the fuse macro includes a fuse control for controlling the processing of fuse repair data in the fuse macro, which is shared between all of the DRAM memories on the chip, and includes a primary decompression fuse bay for the set of primary fuses and a secondary overlay fuse bay for the set of secondary fuses.

22. The system of claim 21, wherein the primary decompression fuse bay uses compression of fuse repair data, and the secondary overlay fuse bay stores string count pointers and associated masking bits.

23. In an integrated circuit having a plurality of separate RAM memories, a method for repairing defects in the plurality of separate RAM memories comprising:
- providing a fuse macro that is shared between the plurality of separate RAM memories, and comprising a set of primary fuses for correcting defects discovered during a first test performed on the plurality of separate RAM memories, resulting in first fuse repair data that is compressed and stored as compressed fuse repair data in the set of primary fuses, and a set of secondary fuses for correcting defects discovered during a second subsequent test performed on the plurality of separate RAM memories, resulting in second fuse repair data that is stored in the set of secondary fuses;
- blowing the primary and secondary fuses in correspondence with discovered defects.

24. The method of claim 23, including using a failing address register (FAR) as a shift register in the memory during compression and decompression of fuse repair data, and using the FAR shift register as a parallel loaded register during Built-In Self Test (BIST), and to provide a serial fuse repair data stream to the memory.

25. The method of claim 23, including providing the fuse macro with a fuse control for controlling the processing of fuse repair data in the fuse macro, which is shared between all of the DRAM memories on the chip, and includes a primary decompression fuse bay for the set of primary fuses and secondary overlay fuse bay for the set of secondary fuses.

26. The method of claim 25, wherein the primary decompression fuse bay uses compression of fuse repair data, and the secondary overlay fuse bay stores string count pointers and associated masking bits.

* * * * *